(12) United States Patent
Ito

(10) Patent No.: US 10,707,406 B2
(45) Date of Patent: Jul. 7, 2020

(54) METHOD FOR MANUFACTURING PIEZOELECTRIC DEVICE

(71) Applicant: Murata Manufacturing Co., Ltd., Nagaokakyo-shi, Kyoto-fu (JP)

(72) Inventor: Korekiyo Ito, Nagaokakyo (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 532 days.

(21) Appl. No.: 15/473,661

(22) Filed: Mar. 30, 2017

(65) Prior Publication Data

US 2017/0200882 A1 Jul. 13, 2017

Related U.S. Application Data

(60) Division of application No. 13/850,520, filed on Mar. 26, 2013, now Pat. No. 9,647,199, which is a
(Continued)

(30) Foreign Application Priority Data

Sep. 28, 2010 (JP) ................................ 2010-216936

(51) Int. Cl.
*H01L 41/253* (2013.01)
*H01L 41/18* (2006.01)
(Continued)

(52) U.S. Cl.
CPC ...... *H01L 41/253* (2013.01); *H01L 21/02694* (2013.01); *H01L 41/0536* (2013.01);
(Continued)

(58) Field of Classification Search
CPC ............... H01L 41/0536; H01L 41/081; H01L 41/0815; H01L 41/0838; H01L 41/18;
(Continued)

(56) References Cited

U.S. PATENT DOCUMENTS

2007/0066052 A1* 3/2007 Ishikawa ............. B81C 1/00071
438/626
2012/0098387 A1* 4/2012 Iwamoto .................. H03H 3/08
310/313 B

FOREIGN PATENT DOCUMENTS

JP 2007181185 A * 7/2007 ......... H03H 9/02015
JP 2012005106 A * 1/2012 ........... H01L 41/312

OTHER PUBLICATIONS

Ito, "Piezoelectric Device and Method for Manufacturing Piezoelectric Device", U.S. Appl. No. 13/850,520, filed Mar. 26, 2013.

* cited by examiner

*Primary Examiner* — A. Dexter Tugbang
(74) *Attorney, Agent, or Firm* — Keating & Bennett, LLP

(57) ABSTRACT

In a method of manufacturing a piezoelectric device, during an isolation formation step, a supporting substrate has a piezoelectric thin film formed on its front with a compressive stress film present on its back. The compressive stress film compresses the surface on a piezoelectric single crystal substrate side of the supporting substrate, and the piezoelectric thin film compresses the back of the supporting substrate, which is opposite to the surface on the piezoelectric single crystal substrate side. Thus, the compressive stress produced by the compressive stress film and that produced by the piezoelectric thin film are balanced in the supporting substrate, which causes the supporting substrate to be free of warpage and remain flat. A driving force that induces isolation in the isolation formation step is gasification of the implanted ionized element rather than the compressive stress to the isolation plane produced by the piezoelectric thin film.

11 Claims, 16 Drawing Sheets

Related U.S. Application Data continuation of application No. PCT/JP2011/072161, filed on Sep. 28, 2011.

(51) Int. Cl.
| | |
|---|---|
| *H01L 41/27* | (2013.01) |
| *H01L 41/08* | (2006.01) |
| *H03H 3/02* | (2006.01) |
| *H03H 3/08* | (2006.01) |
| *H03H 9/02* | (2006.01) |
| *H03H 9/05* | (2006.01) |
| *H03H 9/17* | (2006.01) |
| *H01L 41/312* | (2013.01) |
| *H01L 41/053* | (2006.01) |
| *H01L 21/02* | (2006.01) |
| *H01L 41/083* | (2006.01) |
| *H01L 41/277* | (2013.01) |
| *H01L 41/297* | (2013.01) |
| *H01L 41/332* | (2013.01) |
| *H01L 41/47* | (2013.01) |
| *B81C 1/00* | (2006.01) |

(52) U.S. Cl.
CPC ........ *H01L 41/081* (2013.01); *H01L 41/0815* (2013.01); *H01L 41/0838* (2013.01); *H01L 41/18* (2013.01); *H01L 41/27* (2013.01); *H01L 41/277* (2013.01); *H01L 41/297* (2013.01); *H01L 41/312* (2013.01); *H01L 41/332* (2013.01); *H01L 41/47* (2013.01); *H03H 3/02* (2013.01); *H03H 3/08* (2013.01); *H03H 9/02574* (2013.01); *H03H 9/059* (2013.01); *H03H 9/173* (2013.01); *B81C 1/00071* (2013.01); *Y10T 29/42* (2015.01)

(58) Field of Classification Search
CPC ..... H01L 41/253; H01L 41/27; H01L 41/277; H01L 41/297; H01L 41/312; H01L 41/332; H01L 41/47; H01L 21/02694; H03H 3/02; H03H 3/08; H03H 9/02574; H03H 9/059; H03H 9/173; Y10T 29/42; B81C 1/00071
See application file for complete search history.

METHOD FOR MANUFACTURING PIEZOELECTRIC DEVICE

BACKGROUND OF THE INVENTION

1. Field of the Invention

The present invention relates to a piezoelectric device that includes a thin film made of a piezoelectric single crystal material and a method for manufacturing this piezoelectric device.

2. Description of the Related Art

Many kinds of piezoelectric devices that utilize a piezoelectric thin film, i.e., thin-film piezoelectric devices, are now under development. There are many ways to produce a piezoelectric thin film for the fabrication of thin-film piezoelectric devices. For example, Japanese Unexamined Patent Application Publication No. 2002-534886 proposes a method for manufacturing a piezoelectric device in which a piezoelectric thin film is formed by isolation from a piezoelectric substrate at an ion-implanted layer as the isolation plane.

The following describes this manufacturing method of a piezoelectric device, which includes forming a piezoelectric thin film by isolation from a piezoelectric substrate at an ion-implanted layer as the isolation plane, with reference to FIGS. 1A-1D.

FIGS. 1A-1D are schematic cross-sectional diagrams illustrating the manufacturing steps of a piezoelectric device according to Japanese Unexamined Patent Application Publication No. 2002-534886. The first step is to implant hydrogen ions into a piezoelectric substrate 5 from the front 7 side such that an ion-implanted layer 6 is formed at a predetermined depth d in the piezoelectric substrate 5 as illustrated in FIG. 1A. A coupling material 8 is then deposited on the front 7 of the piezoelectric substrate 5 by sputtering as illustrated in FIG. 1B. The next step is to join the piezoelectric substrate 5 and a supporting substrate 9 as illustrated in FIG. 1C. Finally, the joined body of the piezoelectric substrate 5 and the supporting substrate 9 is heated to initiate isolation at the ion-implanted layer 6 as the isolation plane. As a result, a piezoelectric thin film 5' is formed on the supporting substrate 9 as illustrated in FIG. 1D.

In the manufacturing method according to Japanese Unexamined Patent Application Publication No. 2002-534886, however, ion implantation (see FIG. 1A) causes the piezoelectric substrate 5 warped with the ion-implanted layer 6 side of the piezoelectric substrate 5 to be curved outwards as illustrated in FIG. 2A. This type of warpage occurs because the implanted ionized element causes the crystal lattice spacing of the piezoelectric material to extend in the ion-implanted portion of the piezoelectric substrate 5.

When the piezoelectric substrate 5 is in such a warped shape, bonding it to a supporting substrate 9 (see FIG. 1C) results in the piezoelectric material existing on the surface 7 on the ion-implanted layer 6 side adhering to the supporting substrate 9 with its crystal lattice spacing longer than that before ion implantation. Isolation at the ion-implanted layer after bonding to the supporting substrate 9 therefore causes the piezoelectric thin film 5' to produce a compressive stress that compresses the back 4 of the supporting substrate 9, which is opposite to the surface on the piezoelectric thin film 5' side, making the supporting substrate 9 after isolation warped with the piezoelectric thin film 5' side curved outwards as illustrated in FIG. 2B.

This means that piezoelectric thin film devices produced by the manufacturing method according to Japanese Unexamined Patent Application Publication No. 2002-534886 are disadvantageous because the compressive stress exerted on the isolation plane during this isolation operation leads to a degraded surface roughness of the piezoelectric thin film 5'. Worse yet, this compressive stress is localized in the isolation plane, and the supporting substrate 9 after isolation is likely to crack.

SUMMARY OF THE INVENTION

Preferred embodiments of the present invention provide a piezoelectric device free of the problems associated with ion implantation, i.e., the degradation of the surface roughness of the piezoelectric thin film and the cracking of the supporting substrate, and a method for manufacturing this piezoelectric device.

A piezoelectric device according to a preferred embodiment of the present invention includes a support, a piezoelectric single crystal thin film located on the support and formed by isolation from a piezoelectric single crystal substrate containing an ionized element implanted thereinto at a concentration peak of the implanted element as an isolation plane, an electrode film located on the piezoelectric single crystal thin film, and a stress layer arranged to cause a surface on the piezoelectric single crystal thin film side of the support to contract.

In this configuration, the stress layer causes the surface on the piezoelectric single crystal thin film side of the support to contract. In other words, the contraction stress produced by the stress layer and the compressive stress produced by the piezoelectric single crystal thin film are in balance in the support.

To this end, this piezoelectric device according to a preferred embodiment of the present invention is produced by a process including an isolation formation step in which a piezoelectric single crystal thin film is formed on the support by isolation from a piezoelectric single crystal substrate containing an ionized element implanted thereinto at the concentration peak of the implanted element as the isolation plane. The driving force that induces isolation in this step is therefore gasification of the implanted ionized element rather than the compressive stress to the isolation plane produced by the piezoelectric single crystal thin film. This prevents the degradation of the surface roughness of the piezoelectric single crystal thin film. Furthermore, the compressive stress produced by the piezoelectric single crystal thin film is no longer localized in the isolation plane, and the cracking of the support that could occur after isolation is prevented.

The manufacturing method of a piezoelectric device configured in this way is therefore free of the degradation of the surface roughness of the piezoelectric single crystal thin film and the cracking of the support.

The stress layer preferably is a compressive stress film located on the back side of the support, which is opposite to the surface on the piezoelectric single crystal thin film side, to compress the surface on the piezoelectric single crystal thin film side of the support.

In this configuration, the compressive stress film compresses the surface on the piezoelectric single crystal thin film side of the support. In other words, the compressive stress produced by the compressive stress film and that produced by the piezoelectric single crystal thin film are in balance in the support.

The compressive stress film preferably is made of silicon oxide, silicon nitride, zinc oxide, tantalum oxide, aluminum nitride, or aluminum oxide, for example.

The stress layer is a tensile stress film located between the piezoelectric single crystal thin film and the support to pull the piezoelectric single crystal thin film.

In this configuration, the tensile stress film pulls the piezoelectric single crystal thin film to compress the surface on the piezoelectric single crystal thin film side of the support. In other words, the tensile stress produced by the tensile stress film and the compressive stress by the piezoelectric single crystal thin film are in balance in the support.

The tensile stress film is preferably made of silicon oxide, silicon nitride, aluminum nitride, or aluminum oxide, for example.

The support preferably includes a supporting layer arranged to support the piezoelectric single crystal thin film and a void layer located between the piezoelectric single crystal thin film and the compressive stress film.

In this configuration, the tensile stress film compresses the surface on the piezoelectric single crystal thin film side of the support. In other words, the tensile stress produced by the tensile stress film and the compressive stress by the piezoelectric single crystal thin film are in balance in the support.

The electrode film preferably is an IDT electrode.

Methods for manufacturing a piezoelectric device according to other preferred embodiments of the present invention produce a piezoelectric device having a support and a piezoelectric single crystal thin film bonded onto the support while solving the problems described above.

A manufacturing method of a piezoelectric device according to a preferred embodiment of the present invention includes at least an ion implantation step, a stress layer formation step, a support formation step, and an isolation formation step. The ion implantation step is a step of implanting an ionized element into a piezoelectric single crystal substrate in a way that a concentration peak of the implanted element is formed in the piezoelectric single crystal substrate. The support formation step is a step of forming a support on the ion implantation plane side of the piezoelectric single crystal substrate. The stress layer formation step is a step of forming a stress layer that causes the surface on the piezoelectric single crystal thin film side of the support contract. The isolation formation step is a step of isolating some amount of the piezoelectric single crystal substrate at the concentration peak of the implanted element as the isolation plane to form the piezoelectric single crystal thin film on the support.

In this manufacturing method, a stress layer is present while the piezoelectric thin film is formed on the support in the isolation formation step. During this step, the stress layer causes the surface on the piezoelectric single crystal thin film side of the support contract. In other words, the contraction stress produced by the stress layer and the compressive stress by the piezoelectric single crystal thin film are in balance in the support.

The driving force that induces isolation in the isolation formation step of this manufacturing method is therefore gasification of the implanted ionized element rather than the compressive stress to the isolation plane produced by the piezoelectric single crystal thin film. This prevents the degradation of the surface roughness of the piezoelectric single crystal thin film. Furthermore, the compressive stress produced by the piezoelectric single crystal thin film is no longer localized in the isolation plane, and the cracking of the support that could occur after isolation is prevented.

The manufacturing method of a piezoelectric device configured in this way is therefore free of the degradation of the surface roughness of the piezoelectric single crystal thin film and the cracking of the support.

In the stress layer formation step, a compressive stress film for compressing the surface on the piezoelectric single crystal thin film side of the support is preferably formed as the stress layer on the back side of the support, which is opposite to the surface on the piezoelectric single crystal thin film side.

In this manufacturing method, a compressive stress film is preferably present on the back of the support, which is opposite to the surface on the piezoelectric single crystal thin film side, while the piezoelectric thin film is formed on the support in the isolation formation step. During this step, the compressive stress film compresses the surface on the piezoelectric single crystal thin film side of the support. In other words, the compressive stress produced by the compressive stress film and that by the piezoelectric single crystal thin film are in balance in the support.

In the stress layer formation step, an ion-implanted layer is preferably formed as the stress layer on the back side of the support, which is opposite to the surface on the piezoelectric single crystal thin film side.

In this manufacturing method, the ion-implanted layer compresses the surface on the piezoelectric single crystal thin film side of the support after the isolation formation step. In other words, the compressive stress produced by the ion-implanted layer and that by the piezoelectric thin film are in balance in the support.

The support formation step is preferably carried out after the stress layer formation step, and in the stress layer formation step, a tensile stress film for pulling the piezoelectric single crystal thin film is preferably formed as the stress layer on the ion implantation plane side of the piezoelectric single crystal substrate.

In this manufacturing method, a tensile stress film and a single-crystal piezoelectric thin film are stacked on the front of the support in this order in the isolation formation step. During this step, the tensile stress film pulls the piezoelectric thin film to compress the surface on the piezoelectric single crystal thin film side of the support. In other words, the tensile stress produced by the tensile stress film and the compressive stress by the piezoelectric thin film are in balance in the support.

A method for manufacturing a piezoelectric device according to a preferred embodiment of the present invention preferably includes at least an electrode film formation step. The electrode film formation step is a step of forming an IDT (Interdigital Transducer) electrode film on the piezoelectric single crystal thin film formed on the front of the support.

A method for manufacturing a piezoelectric device according to a preferred embodiment of the present invention includes at least a sacrificial layer formation step, an exposure step, and a sacrificial layer removal step. The sacrificial layer formation step is a step of forming a sacrificial layer in a space defined to later serve as a void layer existing between the piezoelectric single crystal thin film and the support. The exposure step is a step of partially exposing the sacrificial layer on the front side of the piezoelectric thin film by etching the piezoelectric crystal thin film to form a hole therethrough. The sacrificial layer removal step is a step of removing the sacrificial layer through the hole.

Piezoelectric devices produced by this manufacturing method preferably include a membrane structure. In this manufacturing method, a tensile stress film and a single-crystal piezoelectric thin film are stacked in this order in the isolation formation step on the surface of the supporting layer and the sacrificial layer of the support. During this step, the tensile stress film compresses the surface on the piezoelectric single crystal thin film side of the support and of the sacrificial layer. In other words, the tensile stress produced by the tensile stress film and the compressive stress by the piezoelectric thin film are in balance in the support.

One of the advantageous effects of a preferred embodiment of the present invention is to prevent the degradation of the surface roughness of the piezoelectric single crystal thin film and the cracking of the support.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes the manufacturing method of piezoelectric devices according to preferred embodiments of the present invention with reference to drawings. In the following description, a method for manufacturing surface acoustic wave devices is described as an illustrative manufacturing method of piezoelectric devices, for example.

Figure 1A:
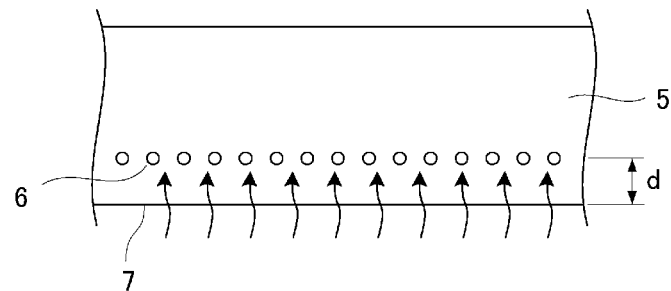
FIGS. 1A-1D are schematic cross-sectional diagrams illustrating the manufacturing steps of a piezoelectric device according to Japanese Unexamined Patent Application Publication No. 2002-534886.
Figure 1B:
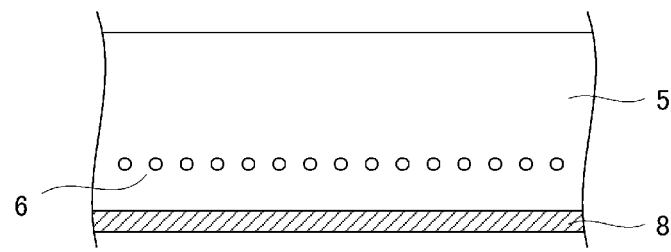
Figure 1C:
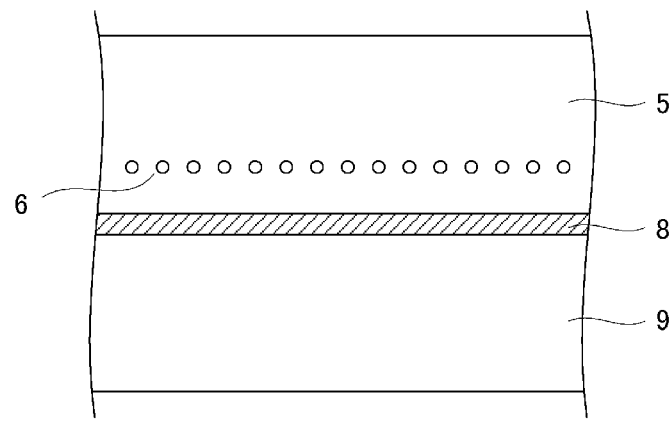
Figure 1D:
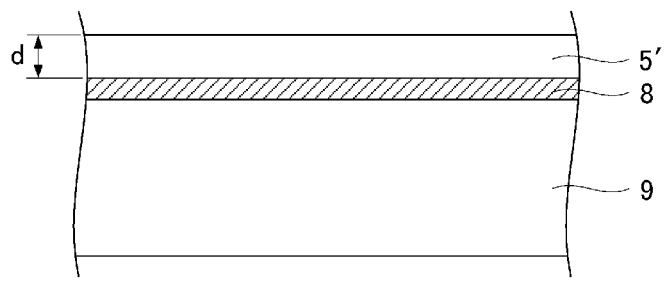
Figure 2A:
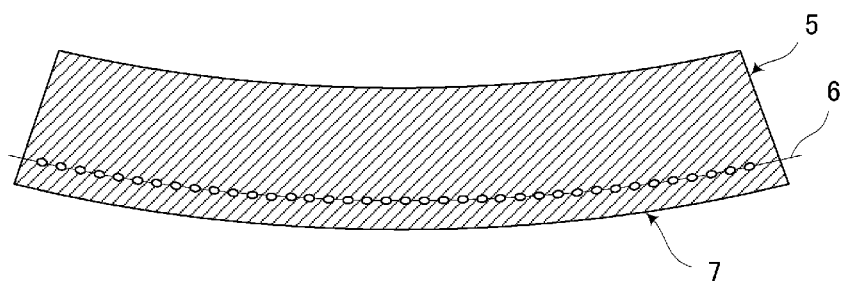
FIG. 2A is a schematic diagram illustrating a piezoelectric substrate warped by the action of a piezoelectric thin film formed by ion implantation.
Figure 2B:
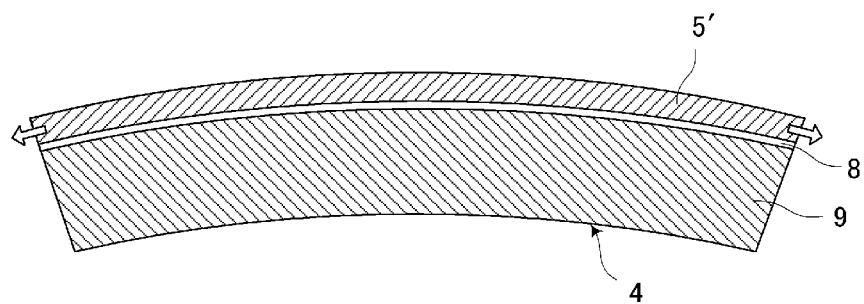
FIG. 2B is a schematic diagram illustrating a supporting substrate warped by the action of the piezoelectric thin film after an isolation step.
Figure 3:
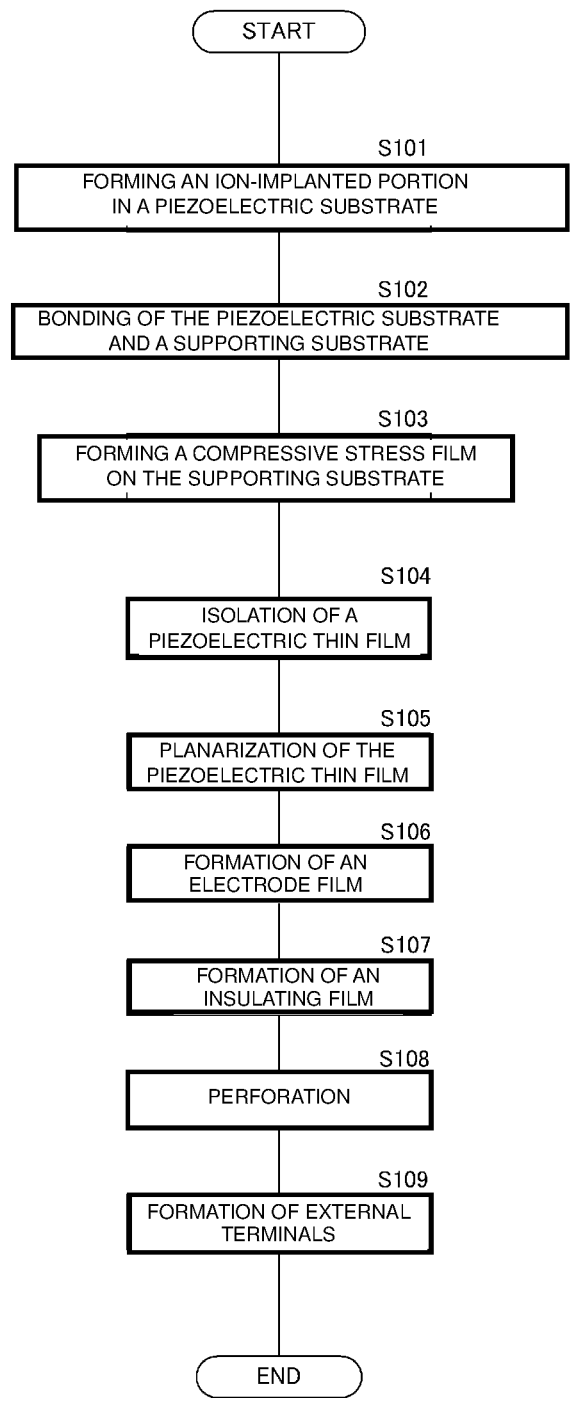
FIG. 3 is a flowchart illustrating the manufacturing method of piezoelectric devices according to Preferred Embodiment 1 of the present invention.

FIG. 3 is a flowchart illustrating the manufacturing method of piezoelectric devices according to Preferred Embodiment 1 of the present invention. FIGS. 4A, 4B, 5A-5C, 7A, 7B, 8A and 8B are schematic cross-sectional diagrams illustrating the manufacturing steps of piezoelectric devices according to Preferred Embodiment 1. FIG. 6A is a schematic diagram illustrating a piezoelectric single crystal substrate warped by the action of a piezoelectric thin film formed by ion implantation. FIG. 6B is a schematic diagram illustrating a supporting substrate after an isolation step with no compressive stress film, which supporting substrate is warped by the action of the piezoelectric thin film. FIG. 6C is a schematic diagram illustrating a supporting substrate after an isolation step following the formation of a compressive stress film, which supporting substrate is free of warpage because of the presence of the compressive stress film.

Figure 4A:
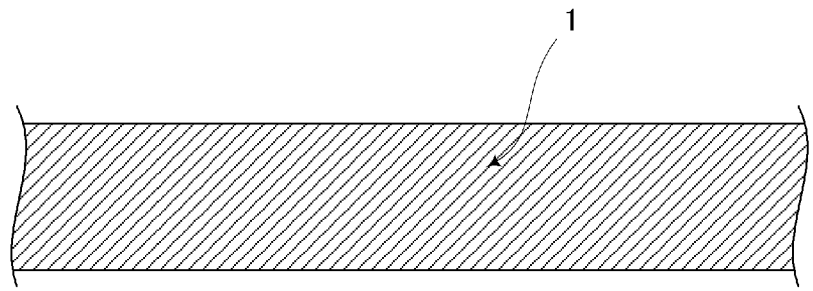
FIGS. 4A and 4B are schematic cross-sectional diagrams illustrating some of the manufacturing steps of piezoelectric devices presented in FIG. 3.
Figure 5A:
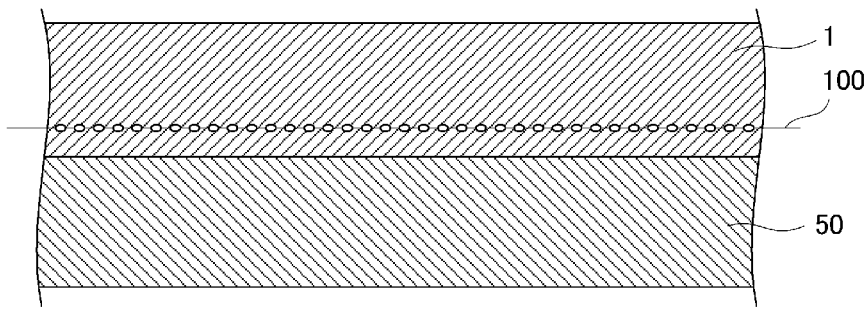
FIGS. 5A-5C are schematic cross-sectional diagrams illustrating some of the manufacturing steps of piezoelectric devices presented in FIG. 3.

The first step is to prepare a piezoelectric single crystal substrate 1 having a predetermined thickness as illustrated in FIG. 4A. A supporting substrate 50 having a predetermined thickness, illustrated later in FIG. 5A, is also prepared. The piezoelectric single crystal substrate 1 preferably is a lithium tantalate substrate, and the supporting substrate 50 preferably is a Si substrate. It is not essential that the piezoelectric single crystal substrate 1 be a lithium tantalate substrate; it may be a lithium niobate substrate, a lithium tetraborate substrate, a langasite substrate, or a potassium niobate substrate, for example. Likewise, it is not essential that the supporting substrate 50 be a Si substrate; glass or other ceramic materials, quartz, sapphire, and similar materials may also be used, for example. Preferably, the same material as that of the piezoelectric substrate is used because this ensures that the two substrates have an equal coefficient of linear expansion.

Figure 4B:
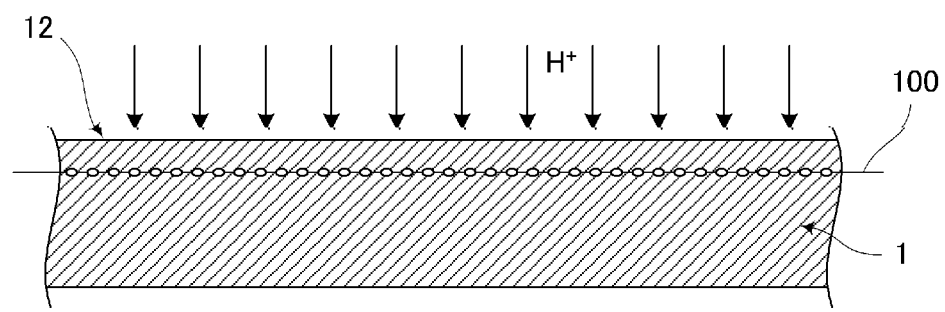

Hydrogen ions are then implanted into the piezoelectric single crystal substrate 1 from the front 12 side in a way that an ion-implanted portion 100 is formed in the piezoelectric single crystal substrate 1 as illustrated in FIG. 4B (S101 in FIG. 3). When the piezoelectric single crystal substrate 1 is a lithium tantalate substrate, for example, hydrogen ion implantation with an acceleration energy of about 150 KeV and a dose of about $1.0 \times 10^{17}$ atoms/cm$^2$ produces a hydrogen-containing portion at a depth of about 1 μm from the front 12, thus forming the ion-implanted portion 100. This ion-implanted portion 100 is the concentration peak of the ionized element implanted into the piezoelectric single crystal substrate 1. Preferably, the thickness of the piezoelectric single crystal substrate 1 is at least 10 times the depth of the hydrogen ion layer because a thickness less than 10 times this depth causes the piezoelectric single crystal substrate 1 to be excessively warped.

When the raw material of the piezoelectric single crystal substrate 1 is not a lithium tantalate substrate, the conditions of ion implantation are adjusted depending on the specific substrate used.

The supporting substrate 50 is then bonded to the piezoelectric single crystal substrate 1 as illustrated in FIG. 5A (S102 in FIG. 3). The supporting substrate 50 corresponds to the support referred to in the description of various preferred embodiments of the present invention.

This bonding operation can be done by direct bonding techniques such as bonding after activation or hydrophilization, or bonding using interdiffusion through a metal layer, for example. Although in the present preferred embodiment the supporting substrate 50 preferably is bonded to the piezoelectric single crystal substrate 1, it is possible in practical implementation that the supporting substrate 50 is formed on the piezoelectric single crystal substrate 1 by film formation or a similar process.

The ion implantation in this ion implantation step S101 causes the piezoelectric single crystal substrate 1 to be warped with the ion-implanted portion 100 side of the piezoelectric single crystal substrate 1 curved outwards as illustrated in FIG. 6A. This type of warpage occurs because the implanted ionized element causes the crystal lattice spacing of the piezoelectric material to extend in the ion-implanted portion of the piezoelectric single crystal substrate 1.

When the piezoelectric single crystal substrate 1 is in such a warped shape, bonding the substrate to the supporting substrate 50 would result in the piezoelectric material existing on the surface 12 on the ion-implanted portion 100 side adhering to the supporting substrate 50 with its crystal lattice spacing longer than that before ion implantation. Due to the piezoelectric thin film 10, the isolation in the isolation formation step after bonding to the supporting substrate 50 at the ion-implanted portion as the isolation plane therefore generates a compressive stress that compresses the back 15 of the supporting substrate 50, which is opposite to the surface 14 on the piezoelectric thin film 10 side, thus making the supporting substrate 50 after isolation warped with the piezoelectric thin film 10 side curved outwards as illustrated in FIG. 6B.

Figure 5B:
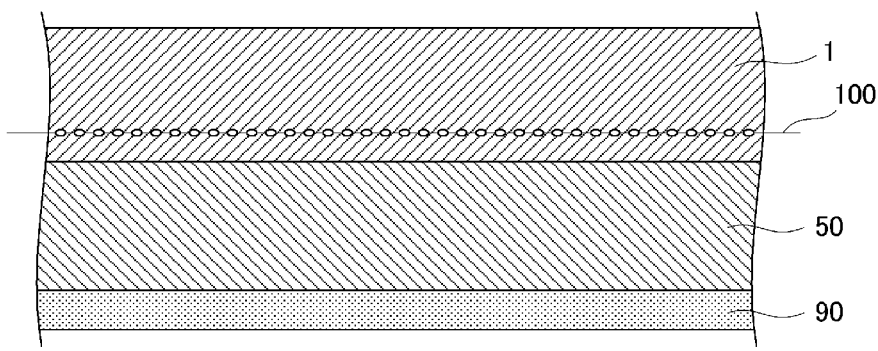
Figure 6A:
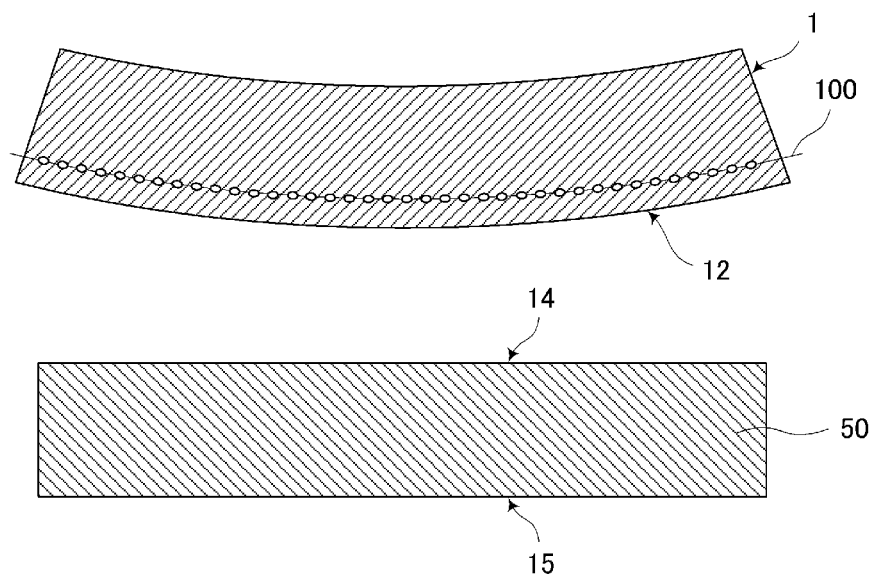
FIG. 6A is a schematic diagram illustrating a piezoelectric single crystal substrate warped by the action of a piezoelectric thin film formed by ion implantation.
Figure 6B:
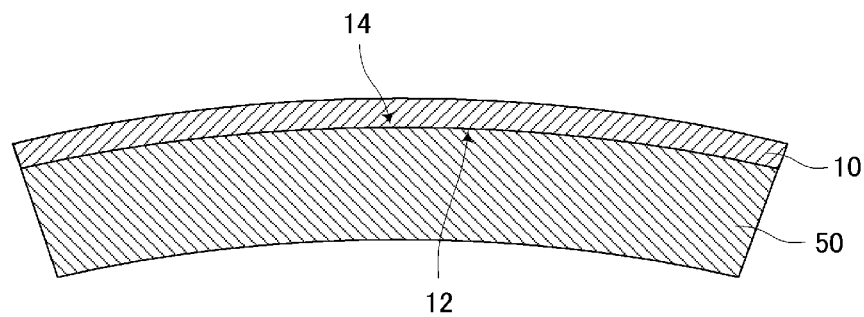
FIG. 6B is a schematic diagram illustrating a supporting substrate after an isolation step with no compressive stress film, which supporting substrate is warped by the action of the piezoelectric thin film.
Figure 6C:
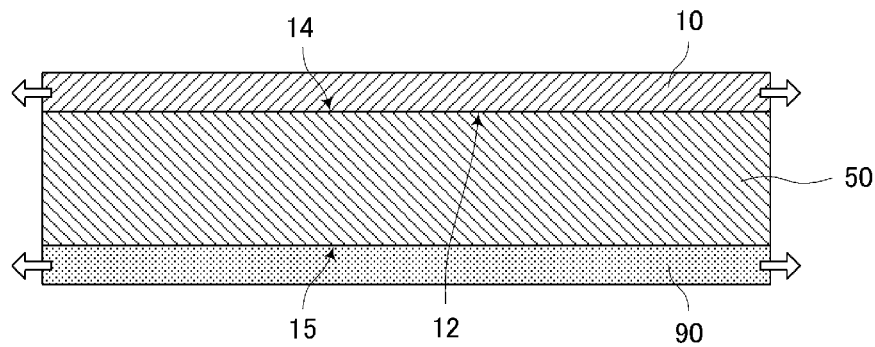
FIG. 6C is a schematic diagram illustrating a supporting substrate after an isolation step following the formation of a compressive stress film, which supporting substrate is free of warpage because of the presence of the compressive stress film.

To prevent this, a compressive stress film 90 is formed on the back 15 of the supporting substrate 50, which is opposite to the surface 14 on the piezoelectric single crystal substrate 1 side, as illustrated in FIG. 5B (S103 in FIG. 3). The compressive stress film 90 is a film that compresses the surface 14 on the piezoelectric single crystal substrate 1 side of the supporting substrate 50, i.e., a stress layer that causes the surface 14 on the piezoelectric single crystal substrate 1 side of the supporting substrate 50 to contract. Non-limiting examples of materials used to make the compressive stress film 90 preferably include silicon oxide, silicon nitride, aluminum oxide, aluminum nitride, zinc oxide, and tantalum oxide. The compressive stress film 90 is formed on the back 15 of the supporting substrate 50, which is opposite to the surface 14 on the piezoelectric single crystal substrate 1 side, preferably by vapor deposition, sputtering, CVD, or a similar method, for example. Regardless of what film formation method is used, the conditions of film formation, such as materials and film thickness, are selected in a way that the formed film compresses the surface 14 on the piezoelectric single crystal substrate 1 side of the supporting substrate 50.

The surface 14 of the supporting substrate 50 corresponds to the surface on the piezoelectric single crystal thin film side of the support referred to in the description of various preferred embodiments of the present invention.

The joined body of the piezoelectric single crystal substrate 1 and the supporting substrate 50 illustrated in FIG. 5B is then heated (for example, to about 500° C. in the present preferred embodiment) to initiate isolation at the ion-implanted portion 100 as the isolation plane (S104 in FIG. 3). The heating temperature in the isolation formation step S104 can be lowered with heating under reduced pressure.

Figure 5C:
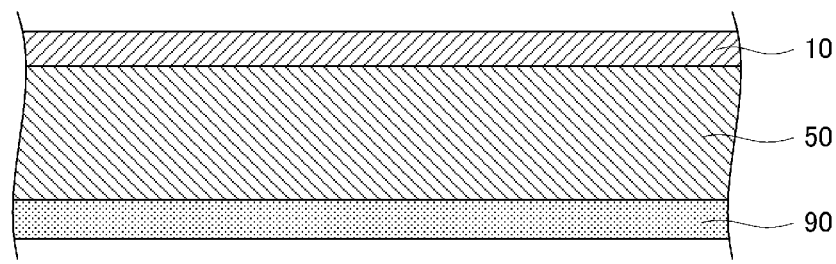

After the isolation formation step S104, the supporting substrate 50 has a single-crystal piezoelectric thin film 10 on its front 14 as illustrated in FIG. 5C.

During the isolation formation step S104, the supporting substrate 50 has a piezoelectric thin film 10 formed on its front 14 with a compressive stress film 90 present on its back 15 as illustrated in FIG. 6C. The compressive stress film 90 compresses the surface 14 on the piezoelectric single crystal substrate 1 side of the supporting substrate 50. In other words, the compressive stress produced by the compressive stress film 90 and that by the piezoelectric thin film 10 are in balance in the supporting substrate 50. As a result, the supporting substrate 50 is free of warpage and able to remain flat.

The driving force that induces isolation in the isolation formation step is therefore gasification of the implanted ionized element rather than the compressive stress to the isolation plane produced by the piezoelectric single film 10. This prevents the degradation of the surface roughness of the piezoelectric thin film 10. An experiment has revealed that the manufacturing method according to Japanese Unexamined Patent Application Publication No. 2002-534886, which does not include a step for forming a compressive stress film 90, results in a surface roughness Ra of 50 nm to 100 nm, whereas the manufacturing method according to the present preferred embodiment, which includes a step for forming a compressive stress film 90, achieves an improved surface roughness Ra of about 10 nm to about 20 nm, for example. Furthermore, the compressive stress produced by the piezoelectric thin film 10 is no longer localized in the isolation plane, and the cracking of the supporting substrate 50 that could occur after isolation is prevented.

The manufacturing method of piezoelectric devices according to the present preferred embodiment is therefore free of the degradation of the surface roughness of the piezoelectric thin film 10 and the cracking of the supporting substrate 50.

In addition to this, the piezoelectric thin film 10 is a single-crystal thin film and thus has higher piezoelectricity than polycrystalline thin films formed by sputtering, vapor deposition, CVD, or a similar method. The crystal orientation of the piezoelectric thin film 10 is inherited from the piezoelectric single crystal substrate 1; the use of a piezoelectric single crystal substrate 1 having a crystal orientation right for the desired characteristics of the piezoelectric devices leads to a piezoelectric thin film 10 being formed with a crystal orientation right for the characteristics. Furthermore, the formation process of the single-crystal thin film preferably includes ion implantation, bonding, and isolation, and thus more than one piezoelectric thin film 10 can be formed from one piezoelectric single crystal substrate 1, and the single-crystal piezoelectric material can be conserved.

Although in the present preferred embodiment a compressive stress film 90 is preferably formed on the back 15 of the supporting substrate 50, which is opposite to the surface 14 on the piezoelectric single crystal substrate 1 side, in the compressive stress film formation step S103, it is possible in practical implementation that hydrogen ions are implanted into the supporting substrate 50 from the back 15 side in a way that an ion-implanted layer similar to the ion-implanted portion 100 is formed in the supporting substrate 50. In this case, the surface 14 on the piezoelectric single crystal substrate 1 side of the supporting substrate 50 is compressed by this ion-implanted layer. In other words, the compressive stress produced by the ion-implanted layer and that by the piezoelectric thin film 10 are in balance in the supporting substrate 50. This approach also causes the supporting substrate 50 to be free of warpage and able to remain flat and thus has similar effects to the manufacturing method according to the present preferred embodiment.

The surface of the piezoelectric thin film 10 formed by isolation is then polished and planarized by CMP or a similar treatment (S105 in FIG. 3). The resulting surface roughness is preferably about 0.5 nm or less, for example, when measured as an arithmetic mean roughness Ra.

Figure 7A:
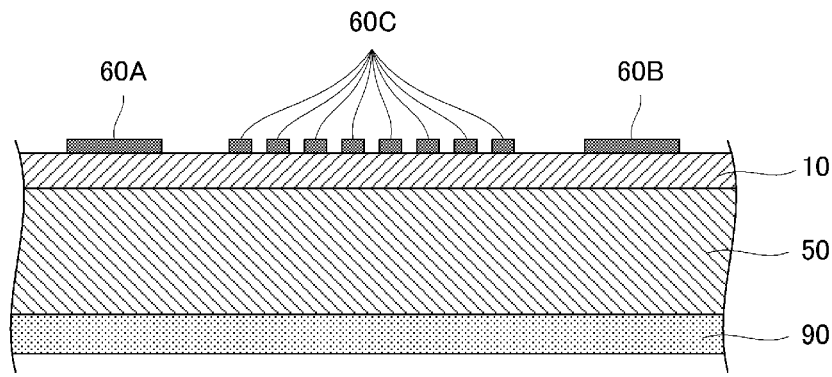
FIGS. 7A and 7B are schematic cross-sectional diagrams illustrating some of the manufacturing steps of piezoelectric devices presented in FIG. 3.

The next step is to form upper electrodes 60A and 60B and an IDT (Interdigital Transducer) electrode 60C having a predetermined thickness on the surface of the piezoelectric thin film 10 from Al (aluminum) or a similar material as illustrated in FIG. 7A (S106 in FIG. 3). The upper electrodes 60A and 60B and the IDT electrode 60C correspond to the electrode film referred to in the description of various preferred embodiments of the present invention.

It is not essential that the electrodes 60A to 60C be made of Al. Alternatively, a layer of or a laminate including more than one layer of Al, W, Mo, Ta, Hf, Cu, Pt, Ti, Au, and similar elements may be used depending on the desired specifications of the devices.

Figure 7B:
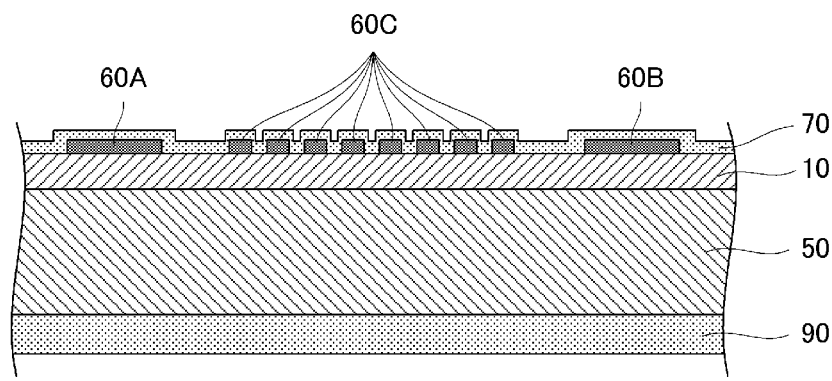

An insulating film 70 is then formed on the surface of the piezoelectric thin film 10 and the electrodes 60A to 60C as illustrated in FIG. 7B to protect these piezoelectric thin film 10 and electrodes 60A to 60C (S107 in FIG. 3).

Figure 8A:
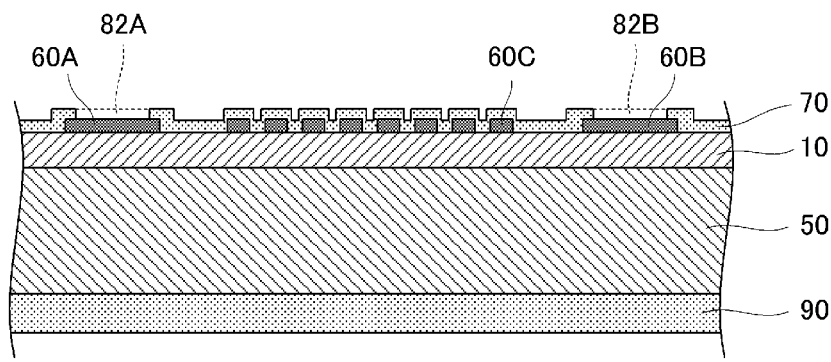
FIGS. 8A and 8B are schematic cross-sectional diagrams illustrating some of the manufacturing steps of piezoelectric devices presented in FIG. 3.

The regions of the insulating film 70 at which the upper electrodes 60A and 60B are to be exposed are then removed by etching or a similar process, forming openings 82A and 82B as illustrated in FIG. 8A (S108 in FIG. 3).

Figure 8B:
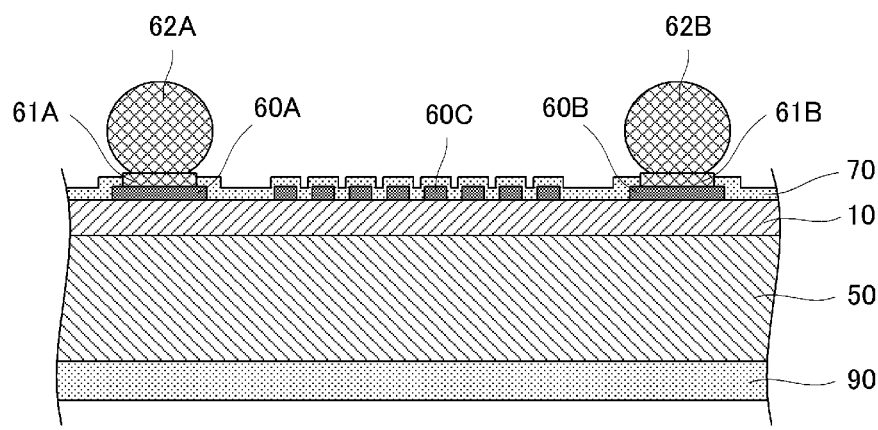

External terminals are then formed as illustrated in FIG. 8B (S109 in FIG. 3). More specifically, bump pads 61A and 61B are formed on the upper electrodes 60A and 60B, and bumps 62A and 62B are formed on these bump pads 61A and 61B.

Finally, the thin-film piezoelectric devices formed on the supporting substrate 50 are diced into separate devices in a dicing step, and each device is packaged using a molding die. As thin-film piezoelectric devices are fabricated in this way, a batch of thin-film piezoelectric devices can be simultaneously produced. The use of the present preferred embodiment, in which a batch of thin-film piezoelectric devices can be simultaneously produced, therefore significantly reduces the manufacturing cost of thin-film piezoelectric devices.

As illustrated in FIG. 8B, a piezoelectric device produced by this manufacturing method has a supporting substrate 50, a single-crystal piezoelectric thin film 10 formed on the supporting substrate 50 by isolation from a piezoelectric single crystal substrate 1 containing ions implanted thereinto at the ion-implanted portion 100, the piezoelectric thin film 10 bonded to the supporting substrate 50, and an IDT electrode film 60C formed on the piezoelectric thin film 10. This piezoelectric device further includes a compressive stress film 90 formed on the back of the supporting substrate 50, which is opposite to the surface on the piezoelectric thin film 10 side, to compress the surface on the piezoelectric thin film 10 side of the supporting substrate 50. The compressive stress film 90 is formed on the supporting substrate 50 side with respect to the piezoelectric thin film 10 and causes the surface on the piezoelectric thin film 10 side of the supporting substrate 50 to contract.

In the present preferred embodiment, the compressive stress produced by the compressive stress film 90 and that by the piezoelectric thin film 10 are in balance after the isolation formation step. The driving force that induces isolation in the isolation formation step for the production of piezoelectric devices having the above configuration is therefore gasification of the implanted ionized element rather than the compressive stress to the isolation plane produced by the piezoelectric single crystal thin film 10. Piezoelectric devices according to the present preferred embodiment can therefore be manufactured without degradation of the surface roughness of the piezoelectric thin film 10 or cracking of the supporting substrate 50.

The following describes the manufacturing method of piezoelectric devices according to Preferred Embodiment 2 of the present invention with reference to drawings. In the following description, a method for manufacturing surface acoustic wave devices is detailed as an illustrative manufacturing method of piezoelectric devices.

Figure 9:
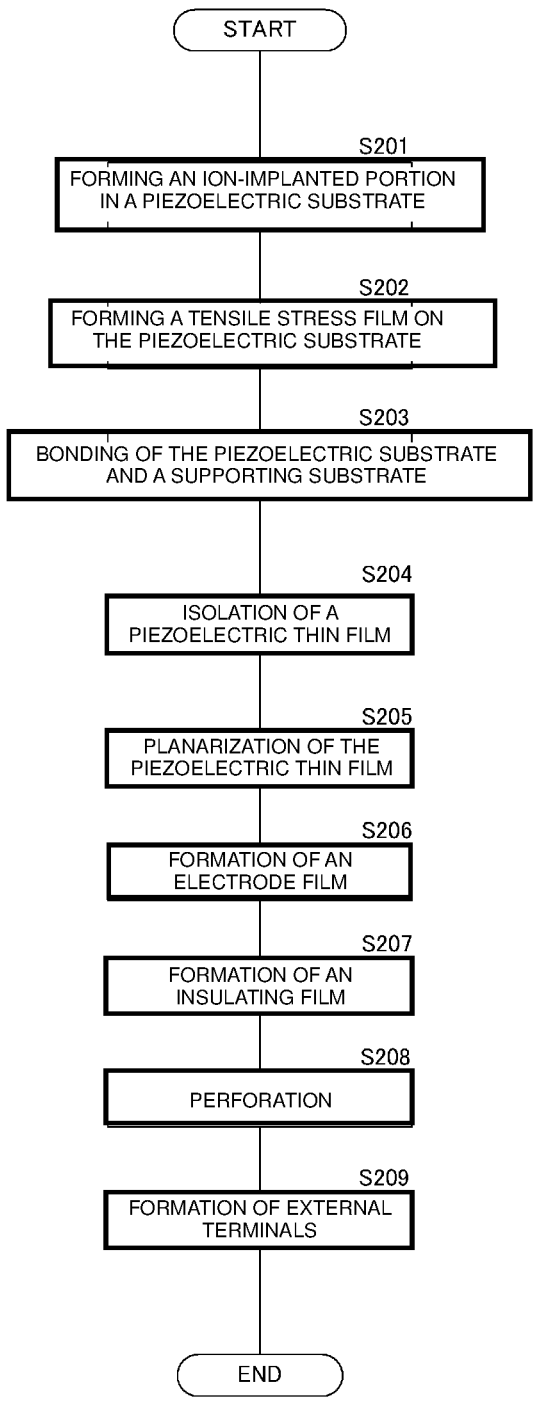
FIG. 9 is a flowchart illustrating the manufacturing method of piezoelectric devices according to Preferred Embodiment 2 of the present invention.

FIG. 9 is a flowchart illustrating the manufacturing method of piezoelectric devices according to Preferred Embodiment 2. FIGS. 10A-10C, 12A, 12B, 13A and 13B show schematic cross-sectional diagrams illustrating the manufacturing steps of piezoelectric devices presented in FIG. 9. FIG. 11 is a schematic diagram illustrating a supporting substrate after an isolation step following the formation of a tensile stress film. This supporting substrate is free of warpage because of the presence of the tensile stress film.

The manufacturing method of piezoelectric devices according to the present preferred embodiment is different from that described in Preferred Embodiment 1 in that a step of forming a tensile stress film (S202) is included and the bonding step (S203) follows it. This means that S201 and S204 to S209 in FIG. 9 are preferably the same as S101 and S104 to S109 in FIG. 3 detailed in Preferred Embodiment 1, respectively.

More specifically, the first step is to prepare a piezoelectric single crystal substrate 1 that contains ions implanted thereinto in step S201.

Figure 10A:
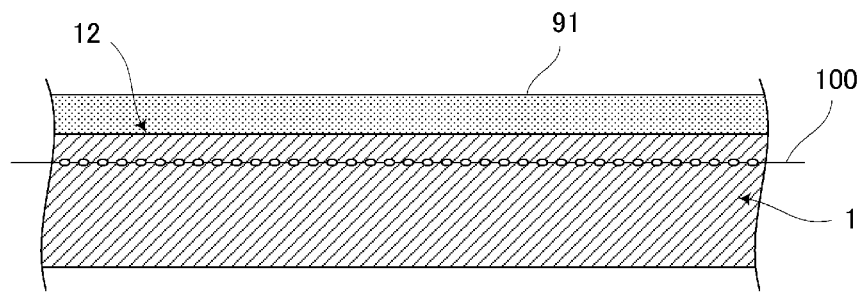
FIGS. 10A-10C are schematic cross-sectional diagrams illustrating some of the manufacturing steps of piezoelectric devices presented in FIG. 9.
Figure 11:
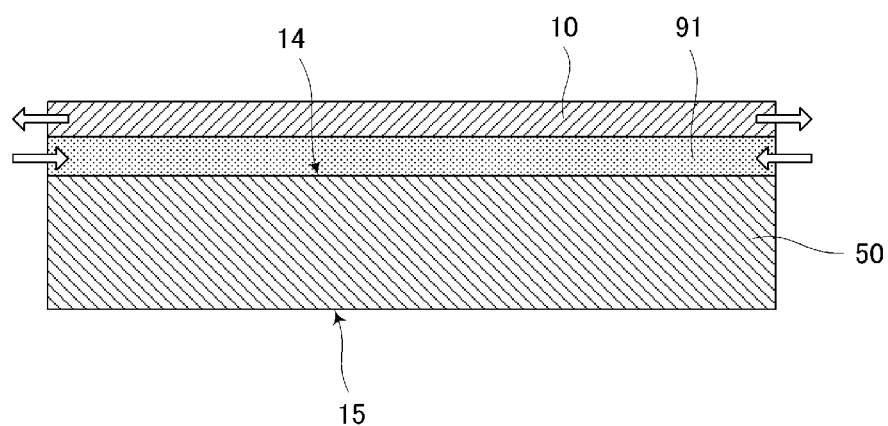
FIG. 11 is a schematic diagram illustrating a supporting substrate after an isolation step following the step of forming a tensile stress film indicated in FIG. 9, which supporting substrate is free of warpage because of the presence of the tensile stress film.
Figure 12A:
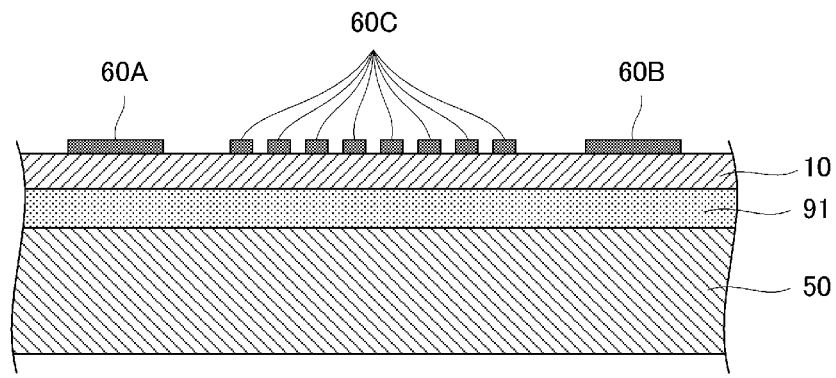
FIGS. 12A and 12B are schematic cross-sectional diagrams illustrating some of the manufacturing steps of piezoelectric devices presented in FIG. 9.
Figure 12B:
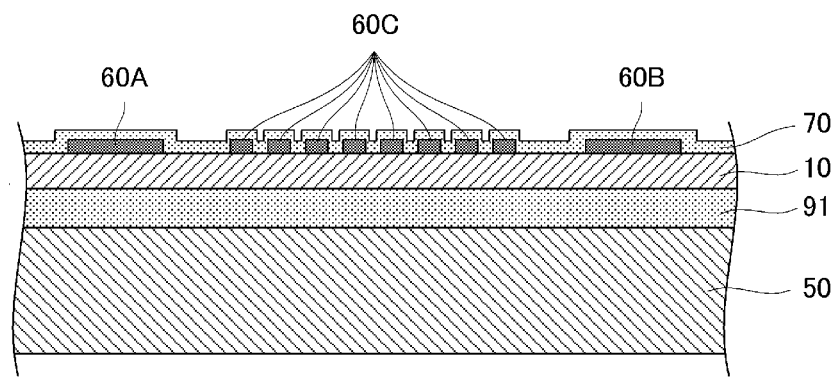

A tensile stress film 91 is then formed on the surface on the ion-implanted portion 100 side of the piezoelectric single crystal substrate 1 as illustrated in FIG. 10A (S202 in FIG. 9). The surface of the tensile stress film 91 is then planarized by CMP or a similar treatment. The tensile stress film 91 is a film for compressing the surface 14 on the piezoelectric single crystal substrate 1 side of the supporting substrate 50, i.e., a stress layer that causes the surface 14 on the piezoelectric single crystal substrate 1 side of the supporting substrate 50 to contract. Non-limiting examples of materials used to make the tensile stress film 91 preferably include silicon oxide, silicon nitride, aluminum oxide, aluminum nitride, zinc oxide, and tantalum oxide. The tensile stress film 91 is formed on the surface 12 on the ion-implanted portion 100 side of the piezoelectric single crystal substrate 1 preferably by vapor deposition, sputtering, CVD, or a similar method. Regardless of what film formation method is used, the conditions of film formation, such as materials and film thickness, are selected in a way that the formed film pulls the surface 14 on the piezoelectric single crystal substrate 1 side of the supporting substrate 50.

Figure 10B:
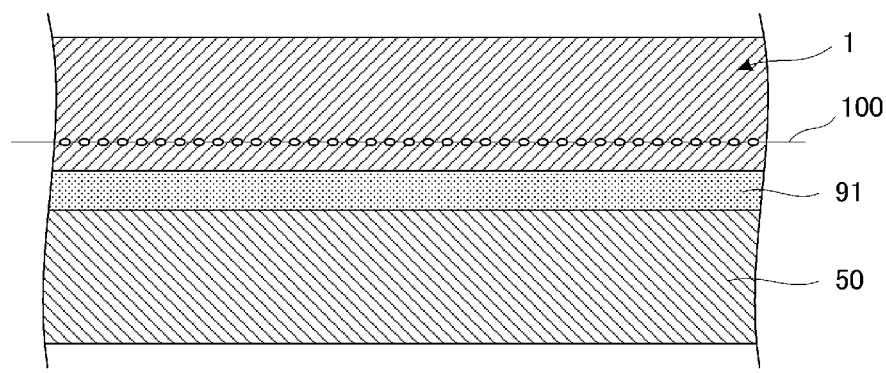

The supporting substrate 50 is then bonded to the piezoelectric single crystal substrate 1 as illustrated in FIG. 10B (S203 in FIG. 9). This bonding method is preferably the same as in Preferred Embodiment 1.

Figure 10C:
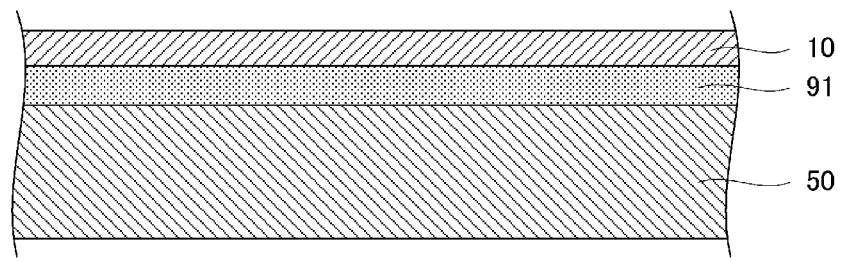

The joined body of the piezoelectric single crystal substrate 1 and the supporting substrate 50 illustrated in FIG. 10C is then heated (preferably to about 500° C. in this preferred embodiment) to initiate isolation at the ion-implanted portion 100 as the isolation plane (S204 in FIG. 9). This isolation method is preferably the same as in Preferred Embodiment 1.

After this isolation formation step S204, the supporting substrate 50 includes the tensile stress film 91 and a single-crystal piezoelectric thin film 10, stacked in this order, on its front 14. The tensile stress film 91 pulls the piezoelectric thin film 10 to compress the surface 14 on the piezoelectric single crystal substrate 1 side of the supporting substrate 50 as illustrated in FIG. 11. In other words, the tensile stress produced by the tensile stress film 91 and the compressive stress by the piezoelectric thin film 10 are in balance in the supporting substrate 50. The present preferred embodiment, therefore, also ensures that the supporting substrate 50 after isolation is free of warpage and able to remain flat.

The manufacturing method of piezoelectric devices according to the present preferred embodiment therefore has similar effects to that according to Preferred Embodiment 1.

Figure 13A:
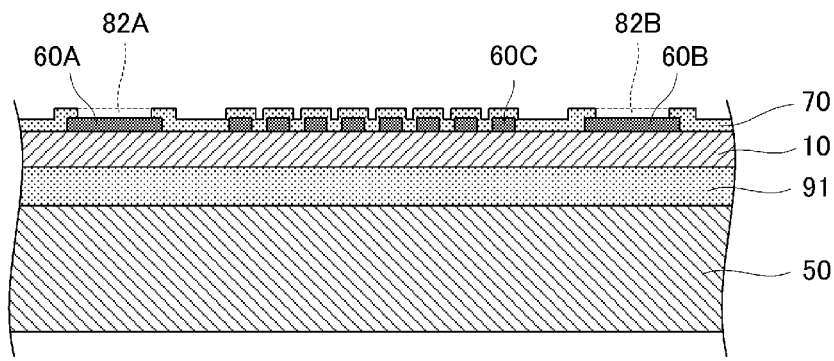
FIGS. 13A and 13B are schematic cross-sectional diagrams illustrating some of the manufacturing steps of piezoelectric devices presented in FIG. 9.
Figure 13B:
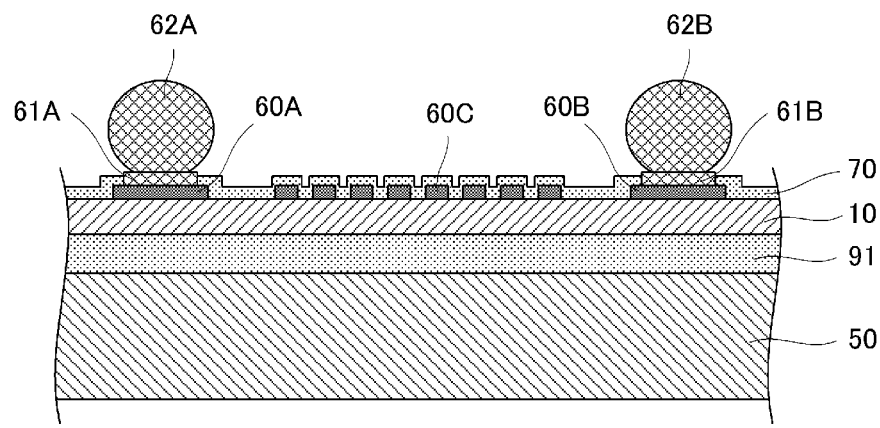

After all the steps following the isolation formation step S204, a piezoelectric device having the structure illustrated in FIG. 13B is obtained. This piezoelectric device includes a supporting substrate 50, a single-crystal piezoelectric thin film 10 formed on the supporting substrate 50 by isolation from a piezoelectric single crystal substrate 1 containing ions implanted thereinto at the ion-implanted portion 100, the piezoelectric thin film 10 bonded to the supporting substrate 50, and an IDT electrode film 60C formed on the piezoelectric thin film 10. This piezoelectric device further includes a tensile stress film 91 disposed between the piezoelectric thin film 10 and the supporting substrate 50 to pull the piezoelectric thin film 10. The tensile stress film 91 is arranged on the supporting substrate 50 side with respect to the piezoelectric thin film 10 and causes the surface on the piezoelectric thin film 10 side of the supporting substrate 50 to contract.

In the present preferred embodiment, the tensile stress produced by the tensile stress film 91 and the compressive stress by the piezoelectric thin film 10 are in balance after the isolation formation step. The driving force that induces isolation in the isolation formation step for the production of piezoelectric devices having the above configuration is therefore gasification of the implanted ionized element rather than the compressive stress to the isolation plane produced by the piezoelectric single crystal thin film 10. Piezoelectric devices according to the present preferred embodiment can therefore be manufactured without degradation of the surface roughness of the piezoelectric thin film 10 or cracking of the supporting substrate 50.

The following describes the manufacturing method of piezoelectric devices according to Preferred Embodiment 3 of the present invention with reference to drawings.

Figure 14:
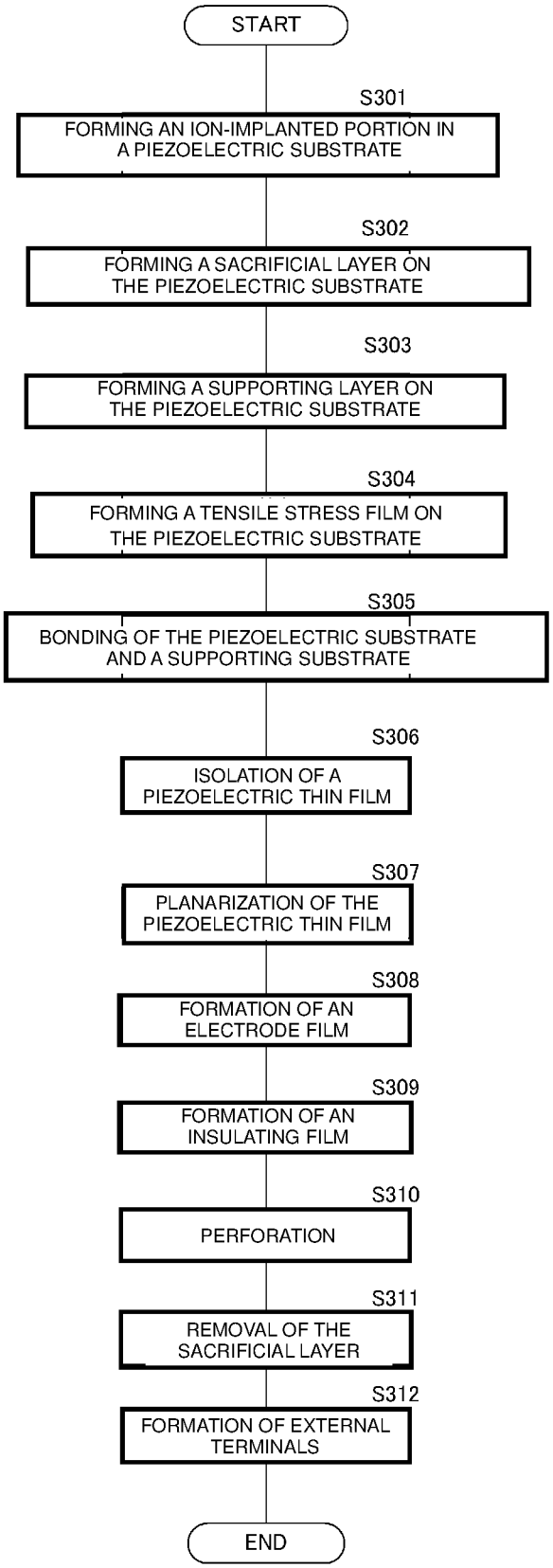
FIG. 14 is a flowchart illustrating the manufacturing method of piezoelectric devices according to Preferred Embodiment 3 of the present invention.

FIG. 14 is a flowchart illustrating the manufacturing method of piezoelectric devices according to Preferred Embodiment 3. FIGS. 15A-15D and 17 show schematic cross-sectional diagrams illustrating the manufacturing steps of piezoelectric devices presented in FIG. 14. FIG. 16 is a schematic diagram illustrating a supporting substrate after an isolation step following the step of forming a tensile stress film. The supporting substrate is free of warpage because of the presence of the tensile stress film. In the following description, a method for manufacturing piezoelectric devices including a membrane structure, such as plate wave devices (see FIG. 17), is detailed as an illustrative manufacturing method of piezoelectric devices.

Steps S301, S307 to S309, and S312 of the manufacturing method of piezoelectric devices according to the present preferred embodiment, indicated in FIG. 14, are the same as steps S201, S205 to S207, and S209 in FIG. 9. The other steps (S302 to S306, S310, and S311) are different.

The first step is to prepare a piezoelectric single crystal substrate 1 that contains ions implanted thereinto in step S301.

A sacrificial layer 30 having a predetermined thickness is then formed on the surface 12 on the ion-implanted portion 100 side of the piezoelectric single crystal substrate 1 (S302 in FIG. 14). More specifically, the sacrificial layer 30 is preferably selected from metal films such as Ni, Cu, and Al, insulating films made of $SiO_2$, ZnO, PSG (phosphosilicate glass) or the like, organic films, and other films as appropriate for the given conditions. The sacrificial layer 30 is formed as a film occupying a space defined on the front of the supporting substrate 50 to later serve as a void layer 80 (i.e., the space beneath the vibrating region of the resulting piezoelectric thin film 10, at which the thin film serves as a piezoelectric device, and beneath holes 81A and 81B) preferably by vapor deposition, sputtering, CVD, spin coating, or a similar method. It is possible in practical implementation that a tensile stress film is formed as the sacrificial layer 30.

Figure 15A:
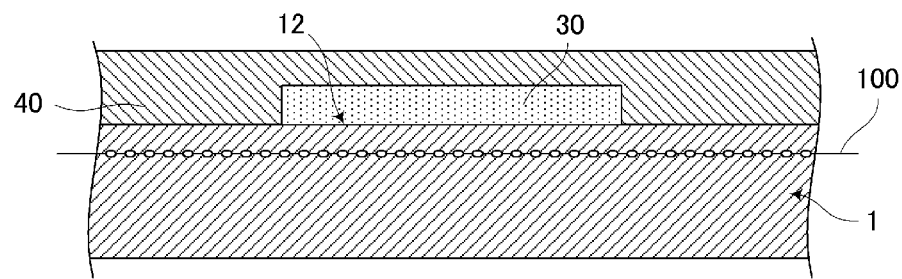
FIGS. 15A-15D are schematic cross-sectional diagrams illustrating some of the manufacturing steps of piezoelectric devices presented in FIG. 14.
Figure 16:
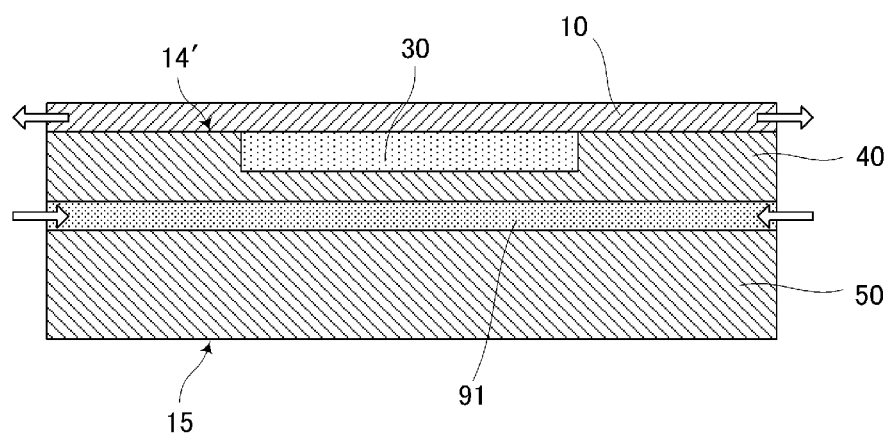
FIG. 16 is a schematic diagram illustrating a supporting substrate after an isolation step following the step of forming a tensile stress film indicated in FIG. 14, which supporting substrate is free of warpage because of the presence of the tensile stress film.

A supporting layer 40 having a predetermined thickness is then formed on the surface 12 on the ion-implanted portion 100 side of the piezoelectric single crystal substrate 1 as illustrated in FIG. 15A (S303 in FIG. 14). The supporting layer 40 is made of an insulating material, and any kind of insulating material can be used as long as it is based on an inorganic substance such as silicon oxide or nitride, aluminum oxide, or PSG or an organic substance such as resin and is highly resistant to the gaseous and/or liquid etchant used to remove the sacrificial layer 30. The supporting layer 40 is formed as a film covering a specific area of the front of the supporting substrate 50 (an area excluding the area occupied by the sacrificial layer 30) preferably by vapor deposition, sputtering, CVD, spin coating, or a similar method. In other words, this supporting layer 40 is formed beneath the static region of the resulting piezoelectric thin film 10, at which the thin film does not serve as a piezoelectric device. The supporting layer 40 is then planarized until its thickness matches the desired depth of the void layer 80, which later serves as the hollow region of the membrane.

Preferably, the material of the supporting layer 40 is determined taking into account the relationship between its coefficient of linear expansion and that of the piezoelectric single crystal substrate 1 and/or the sacrificial layer 30.

Figure 15B:
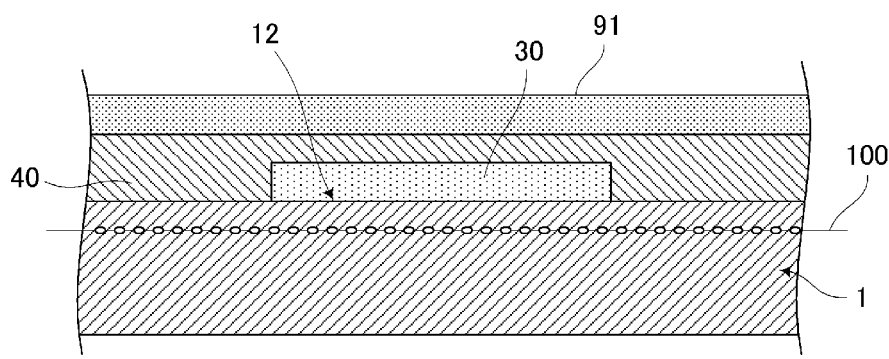

A tensile stress film 91 is then formed on the surface of the sacrificial layer 30 and the supporting layer 40 on the piezoelectric single crystal substrate 1 as illustrated in FIG. 15B (S304 in FIG. 14). The surface of the tensile stress film 91 is then planarized by CMP or a similar treatment. The formation method of the tensile stress film 91 is the same as in S202 in FIG. 9.

Figure 15C:
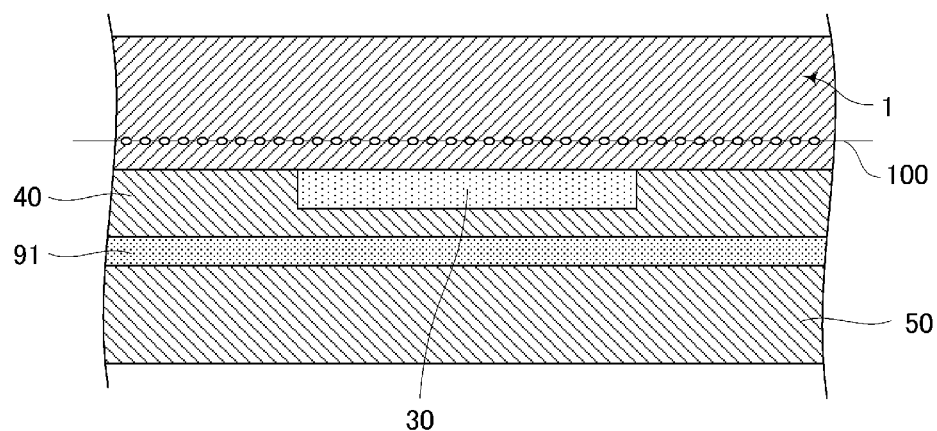
Figure 15D:
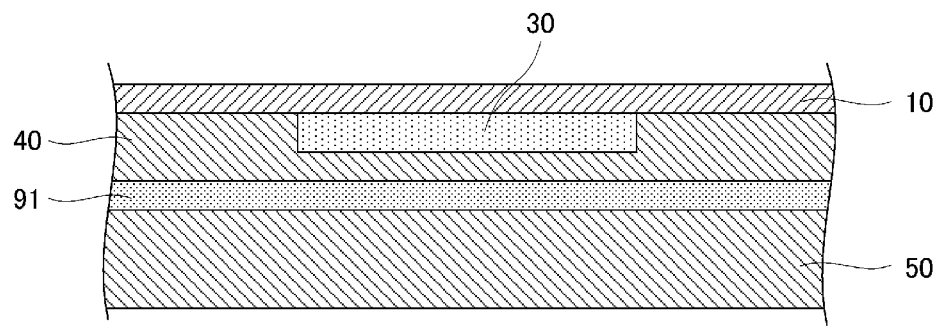

A supporting substrate 50 is then bonded to the surface of the tensile stress film 91 on the piezoelectric single crystal substrate 1 as illustrated in FIG. 15C (S305 in FIG. 14). This bonding method is the same as in Preferred Embodiment 2.

The joined body of the piezoelectric single crystal substrate 1 and the supporting substrate 50 illustrated in FIG. 15C is then heated (preferably to about 500° C. in the present preferred embodiment, for example) to initiate isolation at the ion-implanted portion 100 as the isolation plane (S306 in FIG. 14). This isolation method is the same as in Preferred Embodiment 2.

After this isolation formation step S306, the sacrificial layer 30 and the supporting layer 40 on the supporting substrate 50 have a single-crystal piezoelectric thin film 10 on their surface 14' (see FIG. 16). The tensile stress film 91 compresses the surface 14' of the sacrificial layer 30 and the supporting layer 40 on the supporting substrate 50 as illustrated in FIG. 16. In other words, the tensile stress produced by the tensile stress film 91 and the compressive stress by the piezoelectric thin film 10 are in balance in the supporting substrate 50. The present preferred embodiment, therefore, also ensures that the supporting substrate 50 is free of warpage and able to remain flat.

The manufacturing method of piezoelectric devices according to the present preferred embodiment therefore has similar effects to that according to Preferred Embodiment 1.

Figure 17:
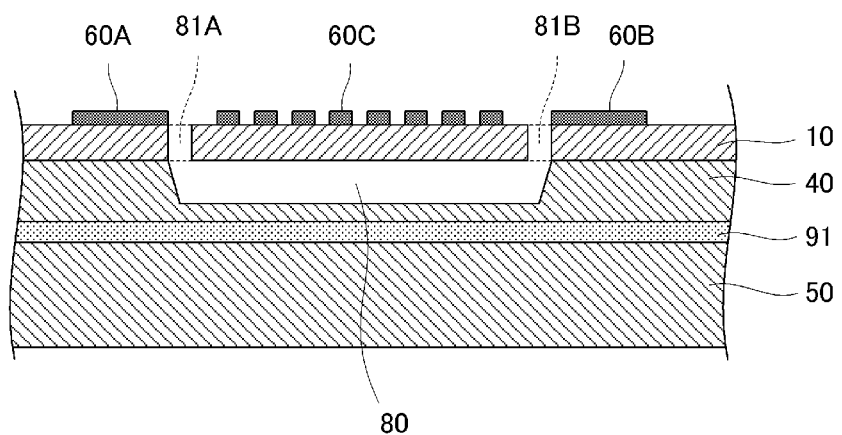
FIG. 17 is a schematic cross-sectional diagram illustrating one of the manufacturing steps of piezoelectric devices presented in FIG. 14.

Then, polishing is performed (S307), upper electrodes 60A and 60B and an IDT electrode 60C are formed as illustrated in FIG. 17 (S308), and an insulating film is formed (S309). These steps are carried out in the same way as in the manufacturing method according to Preferred Embodiment 2.

After photolithographic patterning of a resist film, a gaseous etchant is introduced to form holes 81A and 81B through which the sacrificial layer 30 is partially exposed on the front side of the piezoelectric thin film 10 (S310 in FIG. 14).

A gaseous or liquid etchant is then introduced through the holes 81A and 81B to remove the sacrificial layer 30 (S311 in FIG. 14). This turns the space occupied by the sacrificial layer 30 into a void layer 80 as illustrated in FIG. 17.

External terminals are then formed in the same way as in the manufacturing method of piezoelectric devices according to Preferred Embodiment 2 (S312 in FIG. 14).

Finally, the thin-film piezoelectric devices formed on the supporting substrate 50 are diced into separate devices in a dicing step, and each device is packaged using a molding die. As a result, piezoelectric devices having the structure illustrated in FIG. 17 are obtained. Each of these piezoelectric devices includes a support including a supporting substrate 50, a void layer 80, and a supporting layer 40, a single-crystal piezoelectric thin film 10 formed on the support by isolation from a piezoelectric single crystal substrate 1 containing ions implanted thereinto at the ion-implanted portion 100, the piezoelectric thin film 10 bonded to the support, and an IDT electrode film 60C formed on the piezoelectric thin film 10. This piezoelectric device further includes a tensile stress film 91 arranged between the piezoelectric thin film 10 and the support to pull the piezoelectric thin film 10. The tensile stress film 91 is located on the support side with respect to the piezoelectric thin film 10 and causes the surface on the piezoelectric thin film 10 side of the support to contract.

In this preferred embodiment, the tensile stress produced by the tensile stress film 91 and the compressive stress by the piezoelectric thin film 10 are in balance after the isolation formation step. The driving force that induces isolation in the isolation formation step for the production of piezoelectric devices having the above configuration is therefore gasification of the implanted ionized element rather than the compressive stress to the isolation plane produced by the piezoelectric single crystal thin film 10. Piezoelectric devices according to the present preferred embodiment can therefore be manufactured without degradation of the surface roughness of the piezoelectric thin film 10 or cracking of the supporting substrate 50.

Although the description of the present preferred embodiment takes plate wave devices as an example, manufacturing methods according to the present invention can also be applied to other devices that are based on a piezoelectric single crystal thin film and have a membrane, such as gyroscopic devices, RF switches, and vibrational electric generators.

Furthermore, the descriptions of the above preferred embodiments should be construed as being illustrative in all respects and not restrictive. The scope of the present invention is defined by the claims rather than the above preferred embodiments. It is also intended that the scope of the present invention includes equivalents of the claims and all modifications that fall within the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device including a support and a piezoelectric single crystal thin film formed on the support, the method comprising the steps of:
    implanting an ionized element into a piezoelectric single crystal substrate such that a concentration peak of an implanted element is formed in the piezoelectric single crystal substrate;
    forming the support on an ion implantation plane side of the piezoelectric single crystal substrate;
    forming a stress layer that causes a surface on a piezoelectric single crystal thin film side of the support to contract; and
    isolating some amount of the piezoelectric single crystal substrate at the concentration peak of the implanted element as an isolation plane to form the piezoelectric single crystal thin film on the support.

2. The method according to claim 1, wherein in the step of forming the stress layer, a compressive stress film that compresses the surface on the piezoelectric single crystal thin film side of the support is formed as the stress layer on a back side of the support, which is opposite to the surface on the piezoelectric single crystal thin film side.

3. The method according to claim 1, wherein in the step of forming the stress layer, an ion-implanted layer is formed as the stress layer on a back side of the support, which is opposite to the surface on the piezoelectric single crystal thin film side.

4. The method according to claim 1, wherein
the step of forming the support is carried out after the step of forming the stress layer; and
in the step of forming the stress layer, a tensile stress film that pulls the piezoelectric single crystal thin film is formed as the stress layer on the ion implantation plane side of the piezoelectric single crystal substrate.

5. The method according to claim 1, further comprising a step of forming an electrode film to form an interdigital terminal electrode film on the piezoelectric single crystal thin film.

6. The method according to claim 1, further comprising:
a step of forming a sacrificial layer in a space defined to later serve as a void layer existing between the piezoelectric single crystal thin film and the support;
a step of exposing to partially expose the sacrificial layer on a front side of the piezoelectric thin film by etching the piezoelectric crystal thin film to form a hole through the piezoelectric crystal thin film; and
a step of removing the sacrificial layer through the hole.

7. The method according to claim 6, wherein the stress layer is a compressive stress film located on a back side of the support, which is opposite to the surface on the piezoelectric single crystal thin film side, to compress the surface on the piezoelectric single crystal thin film side of the support.

8. The method according to claim 7, wherein the compressive stress film is made of silicon oxide, silicon nitride, zinc oxide, tantalum oxide, aluminum nitride, or aluminum oxide.

9. The method according to claim 1, wherein the stress layer is a tensile stress film arranged between the piezoelectric single crystal thin film and the support so as to pull the piezoelectric single crystal thin film.

10. The method according to claim 9, wherein the tensile stress film is made of silicon oxide, silicon nitride, aluminum nitride, or aluminum oxide.

11. The method according to claim 1, wherein the piezoelectric device is one of a plate wave device, a gyroscopic device, an RF switch, and a vibrational electric generator.

* * * * *